United States Patent
Tsumura et al.

(10) Patent No.: US 9,935,569 B2
(45) Date of Patent: Apr. 3, 2018

(54) MOTOR DRIVE CONTROL APPARATUS, COMPRESSOR, FAN, AND AIR-CONDITIONING APPARATUS

(71) Applicant: Mitsubishi Electric Corporation, Tokyo (JP)

(72) Inventors: Akihiro Tsumura, Tokyo (JP); Kenta Yuasa, Tokyo (JP); Shinsaku Kusube, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 150 days.

(21) Appl. No.: 14/894,609

(22) PCT Filed: Sep. 30, 2013

(86) PCT No.: PCT/JP2013/076588
§ 371 (c)(1),
(2) Date: Nov. 30, 2015

(87) PCT Pub. No.: WO2015/045169
PCT Pub. Date: Apr. 2, 2015

(65) Prior Publication Data
US 2016/0294312 A1    Oct. 6, 2016

(51) Int. Cl.
*H02P 27/00* (2006.01)
*H02P 6/28* (2016.01)
(Continued)

(52) U.S. Cl.
CPC ............ *H02P 6/28* (2016.02); *H01L 29/1608* (2013.01); *H02M 1/4225* (2013.01);
(Continued)

(58) Field of Classification Search
CPC ............... Y02T 10/645; Y02T 10/7005; Y02T 10/7077; B60W 10/08; B60L 11/14
See application file for complete search history.

(56) References Cited

U.S. PATENT DOCUMENTS

| | | | | |
|---|---|---|---|---|
| 6,244,061 | B1 * | 6/2001 | Takagi | F25B 49/025 62/228.4 |
| 2013/0180273 | A1 * | 7/2013 | Hatakeyama | F04B 35/04 62/115 |
| 2015/0028780 | A1 * | 1/2015 | Hatakeyama | H02P 6/20 318/400.1 |

FOREIGN PATENT DOCUMENTS

CN    101702532    *    5/2010
CN    101702532 A        5/2010
(Continued)

OTHER PUBLICATIONS

Translation of CN101702532 has been attached.*
(Continued)

*Primary Examiner* — Shawki S Ismail
*Assistant Examiner* — Zoheb Imtiaz
(74) *Attorney, Agent, or Firm* — Posz Law Group, PLC

(57) ABSTRACT

A motor drive control apparatus according to the present invention includes: a three-phase rectifier to rectify an AC voltage supplied from a three-phase AC source; a booster circuit including a reactor, a switching element, and a backflow preventing element, to boost a DC bus voltage supplied from the three-phase rectifier; a smoothing capacitor to smooth an output of the booster circuit; and an inverter circuit to convert the DC bus voltage smoothed by the smoothing capacitor into an AC voltage and supplying the AC voltage to a motor. During a starting operation of a boosting operation of the booster circuit or a stopping operation of the boosting operation thereof, a rotation speed of the motor is fixed.

11 Claims, 7 Drawing Sheets

(51) Int. Cl.
      *H02M 5/458*     (2006.01)
      *H01L 29/16*      (2006.01)
      *H02M 1/42*      (2007.01)
      *H02M 1/00*      (2006.01)

(52) U.S. Cl.
      CPC ...... *H02M 5/458* (2013.01); *H02M 2001/007* (2013.01); *H02P 2201/03* (2013.01); *H02P 2201/09* (2013.01); *Y02B 70/126* (2013.01)

(56) References Cited

FOREIGN PATENT DOCUMENTS

| | | |
|---|---|---|
| JP | 2002-064992 A | 2/2002 |
| JP | 2010-187521 A | 8/2010 |
| JP | 2011-160546 A | 8/2011 |
| JP | 2012-196142 A | 10/2012 |
| JP | 2012-235629 A | 11/2012 |
| JP | 2013-062937 A | 4/2013 |

OTHER PUBLICATIONS

Extended European Search Report dated Apr. 13, 2017 issued in the corresponding EP application No. 13894237.0.
International Search Report of the International Searching Authority dated Oct. 22, 2013 for the corresponding international application No. PCT/JP2013/076588 (and English translation).
Japanese Office Action dated Oct. 18, 2016 in the corresponding JP application No. 2015-538811.
Office Action dated Jun. 23, 2017 issued in corresponding CN patent application No. 201380078568.9 (and English tanslation).

\* cited by examiner

MOTOR DRIVE CONTROL APPARATUS, COMPRESSOR, FAN, AND AIR-CONDITIONING APPARATUS

CROSS REFERENCE TO RELATED APPLICATION

This application is a U.S. national stage application of International Application No. PCT/JP2013/076588 filed on Sep. 30, 2013, the disclosure of which is incorporated herein by reference.

TECHNICAL FIELD

The present invention relates to a motor drive control apparatus, a compressor, a fan, and an air-conditioning apparatus.

BACKGROUND ART

As a related-art motor drive control apparatus, there is given one having a structure in which a DC bus voltage for driving an inverter is generated by a rectifier circuit from an AC source such as a commercial power source. Such a motor drive control apparatus is used as, for example, a driving source for a motor of a compressor of an air-conditioning apparatus.

For such use, the motor tends to be designed such that, for the purpose of improving energy consumption efficiency in rated operation, an induced voltage (counter-electromotive force) and a power supply voltage have similar values around a rated rotation speed of the motor. Then, at the time of an overload operation in which the motor is operated at a rotation speed higher than the rated rotation speed of the motor, an output voltage of an inverter circuit is saturated to increase an output current, which leads to a reduction in operation efficiency of the motor, a reduction in operation efficiency of the inverter circuit, and other negative results.

In view of this, in order to suppress such a reduction in operation efficiency, a motor drive control apparatus including a booster circuit is proposed (for example, see Patent Literature 1). The booster circuit is connected between a rectifier circuit and an inverter circuit, and includes a reactor, a backflow preventing diode, and a switching element. A DC bus voltage rectified by the rectifier circuit is boosted by the booster circuit. In the booster circuit, energy is stored in the reactor in ON period of the switching element and the stored energy is discharged in OFF period of the switching element, to thereby boost the DC bus voltage. The boosting of the DC bus voltage in the booster circuit is controlled based on a period of time during which the switching element is turned on (on-duty). Through the boosting of the DC bus voltage in the booster circuit, a voltage to be applied to the motor increases to suppress a current to be applied to the motor, with the result that improvement in operation efficiency and expansion of the operating region are realized.

Moreover, in such a motor drive control apparatus, due to a circuit loss caused when the switching element is driven during the boosting operation of the booster circuit, the operation efficiency is reduced. For this reason, the booster circuit performs the boosting operation only in an operating region in which boosting is required.

CITATION LIST

Patent Literature

Patent Literature 1: Japanese Unexamined Patent Application Publication No. 2012-196142 (paragraph [0012] to paragraph [0059], FIG. 1 to FIG. 16)

SUMMARY OF INVENTION

Technical Problem

In such a motor drive control apparatus, when a starting operation of the boosting operation of the booster circuit is activated to boost the DC bus voltage to a target voltage with rapid voltage change, and if the rotation speed of the motor increases, a current rapidly flows to the AC source side, which deteriorates the controllability of an anti-harmonic device such as an active filter and the controllability of the booster circuit. Moreover, for example, when the responsiveness of a detection circuit is low such as when the DC bus voltage is detected to compute a modulation degree of the inverter circuit, there is a risk in that an excessive voltage may be applied to the motor to cause an overcurrent to flow. Moreover, when the DC bus voltage is boosted to the target voltage with slow voltage change and the rotation speed of the motor increases, a voltage necessary for driving the motor is not obtained and an overcurrent flows through the motor. That is, there is a problem in that the stable operation of the motor drive control apparatus cannot be ensured during the starting operation and a stopping operation of the boosting operation of the booster circuit.

The present invention has been made in the context of the problems described above, and provides a motor drive control apparatus that ensures its stable operation during a start operation and a stopping operation of a boosting operation of a booster circuit. The present invention also provides a compressor, a fan, and an air-conditioning apparatus each using such a motor drive control apparatus.

Solution to Problem

According to one embodiment of the present invention, there is provided a motor drive control apparatus, including: a rectifier to rectify an AC voltage supplied from an AC source; a booster circuit including a reactor, a switching element, and a backflow preventing element, the booster circuit being configured to boost a DC bus voltage supplied from the rectifier; a smoothing capacitor to smooth an output of the booster circuit; an inverter circuit to convert the DC bus voltage smoothed by the smoothing capacitor into an AC voltage and supply the AC voltage to a motor; a boost control unit to control operation of the booster circuit; and an inverter control unit to control operation of the inverter circuit, the inverter control unit being configured to control, while the boost control unit is controlling the booster circuit to perform a starting operation of a boosting operation or a stopping operation of the boosting operation, the inverter circuit to fix a rotation speed of the motor.

According to the motor drive control apparatus of the one embodiment of the present invention, while the boost control unit is controlling the booster circuit to perform the starting operation of the boosting operation or the stopping operation of the boosting operation, the inverter control unit is configured to control the inverter circuit to operate so as to fix the rotation speed of the motor. Thus, the stable operation during the starting operation and the stopping operation of the boosting operation of the booster circuit is ensured.

DESCRIPTION OF EMBODIMENTS

A motor drive control apparatus according to the present invention is hereinafter described with reference to the drawings.

Note that, in the following description, the motor drive control apparatus according to the present invention is configured to drive a motor to be used in a compressor of an air-conditioning apparatus, but the motor drive control apparatus according to the present invention may be configured to drive motors to be used in other kinds of equipment. Moreover, the configurations and the operations described below are merely examples, and the motor drive control apparatus according to the present invention is not limited to the one with such configurations and operations. Moreover, the description or illustration of detailed structures, operations, and the like is simplified or omitted as appropriate. Moreover, overlapping or similar descriptions are simplified or omitted as appropriate.

Embodiment 1

A motor drive control apparatus according to Embodiment 1 of the present invention is now described.

<Configuration of Motor Drive Control Apparatus>

The configuration of the motor drive control apparatus according to Embodiment 1 is hereinafter described.

Figure 1:
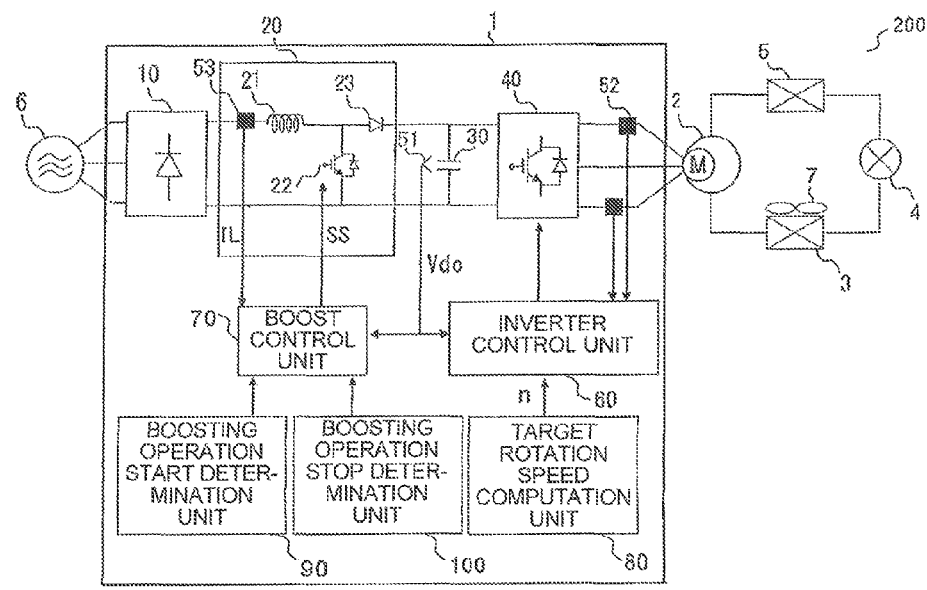
FIG. 1 is a diagram illustrating the configuration of a motor drive control apparatus according to Embodiment 1 of the present invention and the configuration of an air-conditioning apparatus using the motor drive control apparatus.

FIG. 1 is a diagram illustrating the configuration of the motor drive control apparatus according to Embodiment 1 and the configuration of an air-conditioning apparatus using the motor drive control apparatus.

As illustrated in FIG. 1, a motor drive control apparatus 1 converts electric power supplied from a three-phase AC source 6 and supplies the converted electric power to a motor (load M) of a compressor 2 of an air-conditioning apparatus 200. The motor drive control apparatus 1 includes a three-phase rectifier 10, a booster circuit 20, a smoothing capacitor 30, and an inverter circuit 40. In the air-conditioning apparatus 200, the compressor 2, a condenser 3, an expansion device 4, and an evaporator 5 are connected by refrigerant pipes to form a refrigerant circuit. The motor drive control apparatus 1 may be configured to drive a motor of a fan 7 for supplying air to the condenser 3. Moreover, the fan 7 may be configured to supply air to the evaporator 5.

The three-phase rectifier 10 is configured to convert an AC voltage (for example, AC 200 V) of the three-phase AC source 6 into a DC bus voltage. The three-phase rectifier 10 is, for example, a three-phase full-wave rectifier formed by six diodes in bridge connection.

The booster circuit 20 is a circuit (boost chopper circuit) for boosting the DC bus voltage from the three-phase rectifier 10 to, for example, DC 350 V. The booster circuit 20 includes a reactor 21, a switching element 22, and a backflow preventing element 23. The operation of the booster circuit 20 is described in detail later.

As the switching element 22 and the backflow preventing element 23, for example, a wide bandgap semiconductor such as a silicon carbide (SiC) element, a gallium nitride (GaN)-based element, or a diamond element is preferably used, which has a larger band gap than a silicon (Si) element. Moreover, as the switching element 22, a semiconductor element such as MOFET or IGBT may be used other than the wide bandgap semiconductor. Moreover, as the backflow preventing element 23, an element such as a fast recovery diode may be used.

The smoothing capacitor 30 is configured to smooth the output from the booster circuit 20 for charging.

The inverter circuit 40 is configured to convert the DC power stored in the smoothing capacitor 30 into AC power (PWM voltage). The inverter circuit 40 includes a plurality of switching elements. The switching elements are, for example, IGBTs. As the switching elements of the inverter circuit 40, similarly to the switching element 22 described above, the wide bandgap semiconductor such as a silicon carbide (SiC) element may be used. The inverter circuit 40 is connected to the motor of the compressor 2 of the air-conditioning apparatus 200 and supplies an AC current having a predetermined frequency to the motor of the compressor 2.

Moreover, the motor drive control apparatus 1 includes a DC bus voltage detection unit 51, a motor current detection unit 52, and a reactor current detection unit 53. The DC bus voltage detection unit 51 detects a DC bus voltage Vdc that is the output voltage from the booster circuit 20 by measuring the voltage of the smoothing capacitor 30. The motor current detection unit 52 detects the current supplied from the inverter circuit 40 to the motor of the compressor 2. The reactor current detection unit 53 detects a reactor current IL flowing through the reactor 21.

Moreover, the motor drive control apparatus 1 includes an inverter control unit 60 to control the operation of the inverter circuit 40, a boost control unit 70 to control the operation of the booster circuit 20, a target rotation speed computation unit 80 to compute a target rotation speed n of the motor of the compressor 2, a boosting operation start determination unit 90, and a boosting operation stop determination unit 100. The inverter control unit 60, the boost control unit 70, the target rotation speed computation unit 80, the boosting operation start determination unit 90, and the boosting operation stop determination unit 100 are constructed by, for example, the CPU of a microprocessor unit providing commands to execute program modules.

(Target Rotation Speed Computation Unit)

The target rotation speed computation unit 80 calculates, based on information including ambient temperature, preset temperature, and pressure, the target rotation speed n of the motor of the compressor 2 at which a desired refrigeration capacity is obtained, and outputs the target rotation speed n to the inverter control unit 60. The target rotation speed computation unit 80 updates the target rotation speed n to be output to the inverter control unit 60 at intervals of about several seconds to about several tens of seconds. With such a configuration, the stability of the control of the air-conditioning apparatus 200 is improved.

(Inverter Control Unit)

The inverter control unit 60 is configured to control the inverter circuit 40 based on the DC bus voltage Vdc detected by the DC bus voltage detection unit 51 and the current detected by the motor current detection unit 52 (PWM control).

The inverter control unit 60 sets the rotation speed of the motor of the compressor 2 based on the target rotation speed n computed by the target rotation speed computation unit 80 (this rotation speed is referred to as "preset rotation speed N"). The inverter control unit 60 adjusts the frequency of the output voltage of the inverter circuit 40 so as to be the same as the preset rotation speed N, to thereby control the motor of the compressor 2. In the normal state, the preset rotation speed N is set to the same value as the target rotation speed n. The preset rotation speed N is set to a value different from the target rotation speed n when a rotation speed fixation control is performed, which is described later. Note that, in the following description, the boosting operation of the booster circuit 20 is controlled based on the preset rotation speed N of the motor of the compressor 2, but the boosting operation of the booster circuit 20 may be controlled based on a value of the rotation speed of the motor of the compressor 2 detected based on the electric current value of the motor current detection unit 52 or other parameters.

Specifically, the inverter control unit 60 determines, based on the product of the preset rotation speed N and the number of pole pairs of the motor, the frequency of the output voltage of the inverter circuit 40. Moreover, the inverter control unit 60 acquires a voltage command value based on the current detected by the motor current detection unit 52 and the preset rotation speed N, and calculates a modulation degree K by using the following expression (1) with the voltage command value and the DC bus voltage Vdc detected by the DC bus voltage detection unit 51, to thereby compute a period of time during which each of the switching elements of the inverter circuit 40 is turned on (generate a PWM signal). The voltage command value and the rotation speed of the motor of the compressor 2 are substantially proportional to each other, and hence the voltage command value is controlled with increase in the preset rotation speed N of the motor of the compressor 2 increases.

[Math. 1]

$$(\text{Modulation degree } K) = \sqrt{2} \times (\text{voltage command value})/(\text{DC bus voltage Vdc}) \quad (1)$$

(Boost Control Unit)

Figure 2:
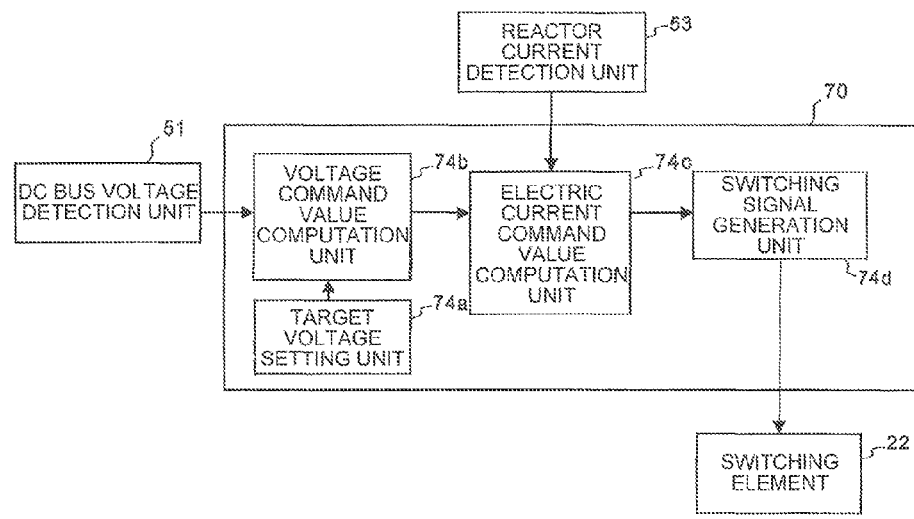
FIG. 2 is a diagram illustrating the configuration of a boost control unit of the motor drive control apparatus according to Embodiment 1.

FIG. 2 is a diagram illustrating the configuration of the boost control unit of the motor drive control apparatus according to Embodiment 1.

As illustrated in FIG. 2, the boost control unit 70 includes a target voltage setting unit 74a, a voltage command value computation unit 74b, an electric current command value computation unit 74c, and a switching signal generation unit 74d.

The target voltage setting unit 74a sets and stores in advance a target voltage value of the DC bus voltage Vdc that is supplied from the booster circuit 20 during the boosting operation (this target voltage value is referred to as "final target voltage value"). The final target voltage value is described in detail later.

The voltage command value computation unit 74b computes the voltage command value based on the final target voltage value set by the target voltage setting unit 74a and the DC bus voltage Vdc detected by the DC bus voltage detection unit 51. A proportional-integral controller (PI controller) can be used for the voltage command value computation unit 74b, for example.

The electric current command value computation unit 74c calculates a switching command value based on the voltage command value computed by the voltage command value computation unit 74b and the reactor current IL detected by the reactor current detection unit 53. A proportional-integral-derivative controller (PID controller) can be used for the electric current command value computation unit 74c, for example.

The switching signal generation unit 74d generates, based on the switching command value computed by the electric current command value computation unit 74c, a switching signal SS for driving the switching element 22. The switching signal SS is a drive pulse (PWM command) and is generated as follows: the switching command value is applied to a carrier wave having a predetermined frequency (for example, triangular wave) for comparison, and a period during which the carrier wave is larger than the switching command value is converted into ON state, whereas a period during which the carrier wave is smaller than the switching command value is converted into OFF state.

(Boosting Operation Start Determination Unit)

The boosting operation start determination unit 90 determines whether or not to start the boosting operation of the booster circuit 20, and outputs the determination result to the boost control unit 70. The boosting operation start determination unit 90 determines, by using a boosting operation start condition described in detail later, whether or not to start the boosting operation of the booster circuit 20.

(Boosting Operation Stop Determination Unit)

The boosting operation stop determination unit 100 determines whether or not to stop the boosting operation of the booster circuit 20, and outputs the determination result to the boost control unit 70. The boosting operation stop determination unit 100 determines, by using a boosting operation stop condition A and a boosting operation stop condition B described in detail later, whether or not to stop the boosting operation of the booster circuit 20.

<Operation of Motor Drive Control Apparatus>

Operation of the motor drive control apparatus according to Embodiment 1 is hereinafter described.

(Operation of Booster Circuit)

Operation of the booster circuit 20 is hereinafter described.

An AC voltage supplied from the three-phase AC source 6 to the three-phase rectifier 10 is rectified by the three-phase rectifier 10 to a DC voltage. When the booster circuit 20 is performing the boosting operation, the DC voltage rectified by the three-phase rectifier 10 is boosted by the booster circuit 20. In the booster circuit 20, when the switching element 22 becomes ON state, electrical connection to the backflow preventing element 23 is blocked so that the voltage rectified by the three-phase rectifier 10 is applied to the reactor 21. On the other hand, when the switching element 22 becomes OFF state, the backflow preventing element 23 is electrically connected so that a voltage, which is reverse to that applied when the switching element 22 becomes ON state, is induced in the reactor 21. That is, it is found that energy is stored in the reactor 21 when the switching element 22 becomes ON state, and the stored energy is transmitted to the inverter circuit 40 serving as a load when the switching element 22 becomes OFF state. Further, the on-duty of the switching element 22 is controlled to control the DC bus voltage Vdc of the booster circuit 20. On the other hand, when the booster circuit 20 is not performing the boosting operation, the switching element 22 does not become ON state and energy is not stored in the reactor 21, and hence the DC voltage rectified by the three-phase rectifier 10 is not boosted.

The booster circuit 20 performs the boosting operation when the motor of the compressor 2 is in a driving state, that is, when the inverter circuit 40 is operating. Thus, the booster circuit 20 does not perform the boosting operation at the initial state.

(Determination on Start of Boosting Operation)

Determination on the start of the boosting operation is hereinafter described.

It is required to increase the output voltage of the inverter circuit 40 as the preset rotation speed N of the motor of the compressor 2 increases. However, in the case of using the three-phase rectifier 10 as in the motor drive control apparatus 1, the output voltage of the inverter circuit 40 is limited by the AC voltage of the three-phase AC source 6 unless the booster circuit 20 performs the boosting operation, which causes an operating region in which the output voltage of the inverter circuit 40 is saturated. If the preset rotation speed N of the motor of the compressor 2 increases with such an operating region, a current to be caused to flow through the motor of the compressor 2 increases to increase a loss (copper loss) in the motor of the compressor 2. In order to suppress this phenomenon, the motor drive control apparatus 1 controls the booster circuit 20 to perform the boosting operation in an overmodulation region (operating region satisfying "modulation degree K>1") in which the output voltage of the inverter circuit 40 is saturated. With such control, the voltage to be applied to the motor of the compressor 2 increases to suppress the current to be caused to flow through the motor of the compressor 2, and hence the operation efficiency is improved.

Moreover, when the booster circuit 20 is performing the boosting operation, losses (such as switching loss and conduction loss) are caused due to the switching operations of the switching element 22 and the backflow preventing element 23. On the other hand, especially when the motor of the compressor 2 in not operating, the preset rotation speed N of the motor of the compressor 2 is low, and the operating region satisfies "modulation degree K<1", or other cases, the output voltage of the inverter circuit 40 is not saturated, and hence the boosting operation of the booster circuit 20 is not required to be performed. Consequently, in the motor drive control apparatus 1, the booster circuit 20 performs the boosting operation only in an operating region in which the boosting operation of the booster circuit 20 is required to be performed.

That is, in the motor drive control apparatus 1, the booster circuit 20 starts the boosting operation only when one of the following expression (2) and expression (3) is satisfied (boosting operation start condition is satisfied). The boosting operation start determination unit 90 determines whether or not one of the expression (2) and the expression (3) is satisfied.

[Math. 2]

$$(\text{Modulation degree } K) > 1 \qquad (2)$$

[Math. 3]

$$(\text{Preset rotation speed } N) > \text{predetermined value} \qquad (3)$$

By the expression (2), only in the operating region in which the output voltage of the inverter circuit 40 is saturated, the booster circuit 20 performs the boosting operation to increase the output voltage of the inverter circuit 40. Moreover, from the expression (3), in a specific operating region, it is possible to suppress the influence of a harmonic component contained in the current supplied from the three-phase AC source 6, on the operation of the motor of the compressor 2. That is, the electric current command value computation unit 74c in the boost control unit 70 calculates the switching command value so that a difference between the voltage command value computed by the voltage command value computation unit 74b and the reactor current IL detected by the reactor current detection unit 53 is eliminated, and hence the reactor current IL is controlled to have a constant value when the booster circuit
    is performing the boosting operation. Thus, through the
    boosting operation of the booster circuit 20, the current
    supplied from the three-phase AC source 6 can have a
    rectangular wave shape and the influence of the harmonic component contained in the current can be
    suppressed. Further, from the expression (3), an operating region in which it is desired to suppress the
    influence of the harmonic component is defined based
    on a relationship between the preset rotation speed N of
    the motor of the compressor 2 and a predetermined
    value. In this way, it is possible to suppress the influence of the harmonic component only in the operating
    region in which it is desired to suppress the influence of
    the harmonic component.

(Outline of Starting Operation and Stopping Operation of Boosting Operation)

Outline of a starting operation and a stopping operation of the boosting operation is hereinafter described. Note that, details of the starting operation and the stopping operation of the boosting operation are described later.

Figure 3:
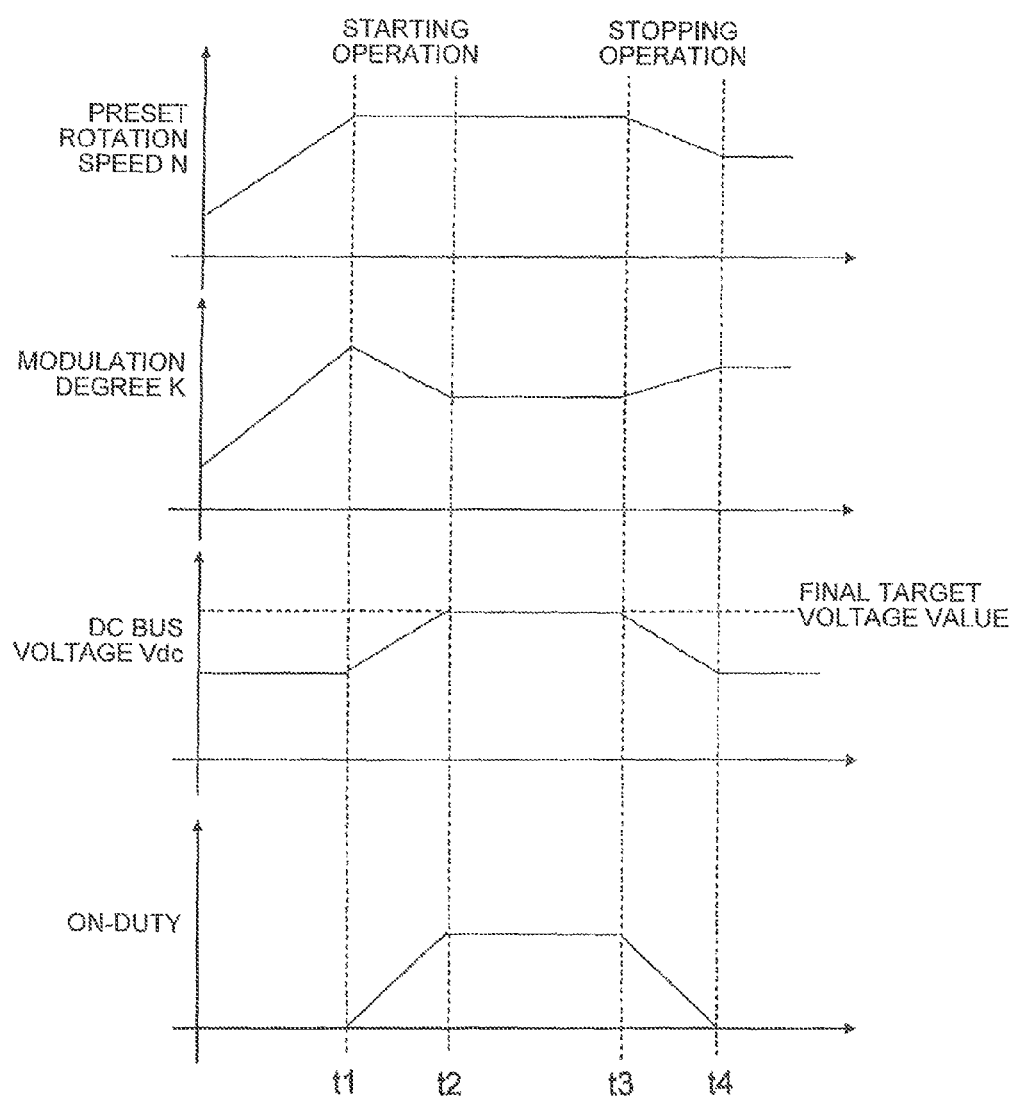
FIG. 3 is a diagram illustrating a time chart of a boosting operation of the motor drive control apparatus according to Embodiment 1.

FIG. 3 is a diagram illustrating a time chart of the boosting operation of the motor drive control apparatus according to Embodiment 1.

The outputs are changed before and after the start and the stop of the boosting operation of the booster circuit 20, as illustrated in FIG. 3.

When receiving a command for starting the boosting operation of the booster circuit 20 from the boosting operation start determination unit 90, the boost control unit 70 starts the switching of the switching element 22 to boost the DC bus voltage Vdc to the final target voltage value set by the target voltage setting unit 74a. The final target voltage value is set in advance in consideration of the maximum rotation speed of the motor of the compressor 2, a loss in the motor of the compressor 2, a circuit loss in the motor drive control apparatus 1, and other factors. The final target voltage value may be a constant value. Moreover, the target voltage setting unit 74a may store, for each preset rotation speed N of the motor of the compressor 2, an optimal final target voltage value in a table, with which a total of the loss in the motor of the compressor 2 and the circuit loss in the motor drive control apparatus 1 is the minimum, and switch the final target voltage value to the one corresponding to the preset rotation speed N of the motor of the compressor 2 by using the information in the table.

The boost control unit 70 may boost the DC bus voltage Vdc to the final target voltage value set by the target voltage setting unit 74a without any limitation on boosting speed or with boosting speed controlled by a target voltage value changing with time.

That is, as illustrated in FIG. 3, a target voltage value of the DC bus voltage Vdc, which is supplied from the booster circuit 20 at the time of the activation of the starting operation of the boosting operation, may be set to the DC bus voltage Vdc detected by the DC bus voltage detection unit 51 immediately before the activation of the starting operation of the boosting operation, and the target voltage value may gradually increase to the final target voltage value with time from the time of the activation of the starting operation of the boosting operation. In this case, abrupt changes in voltage and current are suppressed and the stability of the control is improved. Note that, in such operation, the on-duty of the switching element 22 is 0 (switching is stopped) at the time of the activation of the starting operation of the boosting operation, and gradually increases with time from the time of the activation of the starting operation of the boosting operation. It is preferred that a voltage change amount (slope of voltage change) of the target voltage value per unit time be freely set. The increasing speed of the on-duty of the switching element 22 is changed depending on the voltage change amount.

Moreover, as illustrated in FIG. 3, a target voltage value of the DC bus voltage Vdc, which is supplied from the booster circuit 20 at the time of the activation of the stopping operation of the boosting operation, may be set to the DC bus voltage Vdc detected by the DC bus voltage detection unit 51 immediately before the activation of the stopping operation of the boosting operation, and the target voltage value may gradually decrease with time from the time of the activation of the stopping operation of the boosting operation. Also in this case, abrupt changes in voltage and current are suppressed and the stability of the control is improved. Note that, in such operation, the on-duty of the switching element 22 gradually decreases with time from the time of the activation of the stopping operation of the boosting operation, and finally becomes 0 (switching is stopped). It is preferred that a voltage change amount (slope of voltage change) of the target voltage value per unit time be freely set. The decreasing speed of the on-duty of the switching element 22 is changed depending on the voltage change amount.

(Determination on Stop of Boosting Operation)

Determination on the stop of the boosting operation is hereinafter described.

As shown in the expression (1) and FIG. 3, the modulation degree K reduces as the DC bus voltage Vdc increases, which means that the expression (2) is not satisfied when the booster circuit 20 performs the starting operation of the boosting operation. Consequently, if whether or not to stop the boosting operation of the booster circuit 20 is determined based on the condition that is used for determining whether or not to start the boosting operation of the booster circuit 20, the control becomes unstable. Accordingly, in the motor drive control apparatus 1, the booster circuit 20 stops the boosting operation when the following condition (boosting operation stop condition A or boosting operation stop condition B) is satisfied.

Figure 4:
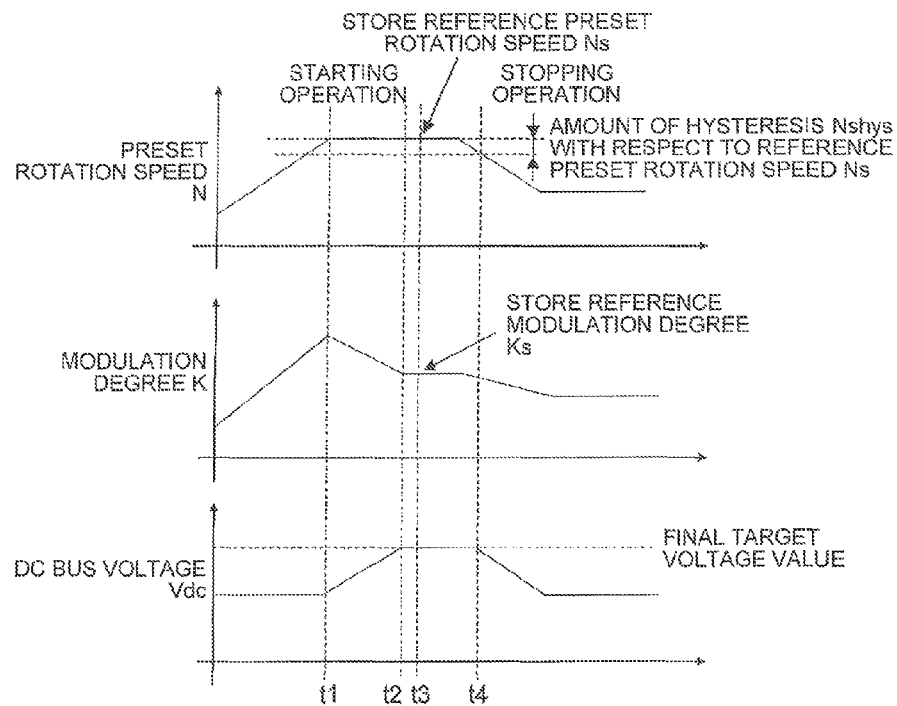
FIG. 4 is a diagram illustrating a time chart of a boosting operation of the motor drive control apparatus according to Embodiment 1.

FIG. 4 is a diagram illustrating a time chart of the boosting operation of the motor drive control apparatus according to Embodiment 1.

As illustrated in FIG. 4, the starting operation of the boosting operation is activated at t1. The DC bus voltage Vdc reaches the final target voltage value to complete the starting operation of the boosting operation at t2, and the modulation degree K at this time is once stored (this modulation degree K is referred to as "reference modulation degree Ks").

As the reference modulation degree Ks, the modulation degree K at the timing at which the DC bus voltage Vdc detected by the DC bus voltage detection unit 51 is matched with the final target voltage value set by the target voltage setting unit 74a, that is, the modulation degree K at t2 may be stored. Alternatively, as the reference modulation degree Ks, the modulation degree K at the timing after the DC bus voltage Vdc detected by the DC bus voltage detection unit 51 is matched with the final target voltage value set by the target voltage setting unit 74a for a predetermined period (about several seconds), that is, the modulation degree K at t3 may be stored. When the modulation degree K at t3 is stored, erroneous detection of the completion of the starting operation of the boosting operation, which is caused due to, for example, voltage overshoot or noise, is prevented.

Moreover, the preset rotation speed N of the motor of the compressor 2 at the same timing of storing the reference modulation degree Ks is once stored (this preset rotation speed N is referred to as "reference preset rotation speed Ns"). As the reference preset rotation speed Ns, as described later, the preset rotation speed N at the timing at which the starting operation of the boosting operation is activated, that is, the preset rotation speed N at t1 may be stored.

Then, in the motor drive control apparatus 1, the booster circuit 20 stops the boosting operation when at least one of the following expression (4) or expression (5) is satisfied (boosting operation stop condition A is satisfied). The boosting operation stop determination unit 100 determines whether or not at least one of the expression (4) or the expression (5) is satisfied. Satisfying both of the expression (4) and the expression (5) may be set as a condition, and the stability of the control is improved in such a case.

[Math. 4]

$$(\text{Modulation degree } K) < (\text{reference modulation degree } Ks) \quad (4)$$

[Math. 5]

$$(\text{Preset rotation speed } N) < (\text{reference preset rotation speed } Ns) - (\text{amount of hysteresis } Nshys \text{ with respect to reference preset rotation speed } Ns) \quad (5)$$

By the expression (4), the stop of the starting operation of the boosting operation, which is caused when the above expression (2) is not satisfied, is prevented, and hence the starting operation of the boosting operation is reliably performed in the operating region in which the output voltage of the inverter circuit 40 is saturated. Moreover, it is defined by the expression (5) that the booster circuit 20 stops the boosting operation when the preset rotation speed N of the motor of the compressor 2 becomes smaller than a value obtained by subtracting the amount of hysteresis Nshys of the reference preset rotation speed Ns (for example, about a few percent of Ns) from the reference preset rotation speed Ns. By the expression (5), the stability of the control is improved when the above expression (3) is satisfied and the booster circuit 20 thus starts the boosting operation.

Moreover, in the motor drive control apparatus 1, the booster circuit 20 stops the boosting operation when the following expression (6) is satisfied (boosting operation stop condition B is satisfied). The boosting operation stop determination unit 100 determines whether or not the expression (6) is satisfied.

[Math. 6]

$$(\text{Preset rotation speed } N) < (\text{boosting operation forced stop rotation speed } N\text{off}) \quad (6)$$

It is defined by the expression (6) that the booster circuit 20 stops the boosting operation when the preset rotation speed N of the motor of the compressor 2 becomes smaller than a boosting operation forced stop rotation speed Noff set in advance. For example, when the voltage of the three-phase AC source 6 unexpectedly greatly reduces, the expression (2) is satisfied and the booster circuit 20 thus starts the boosting operation even in a low rotation speed region in which the boosting operation of the booster circuit 20 is not required to be performed. By the expression (6), however, the boosting operation of the booster circuit 20 is forcibly stopped. Consequently, the reliability of the air-conditioning apparatus 200 is improved.

(Flow of Determining Start and Stop of Boosting Operation)

A flow of determining the start and the stop of the boosting operation is hereinafter described.

Figure 5:
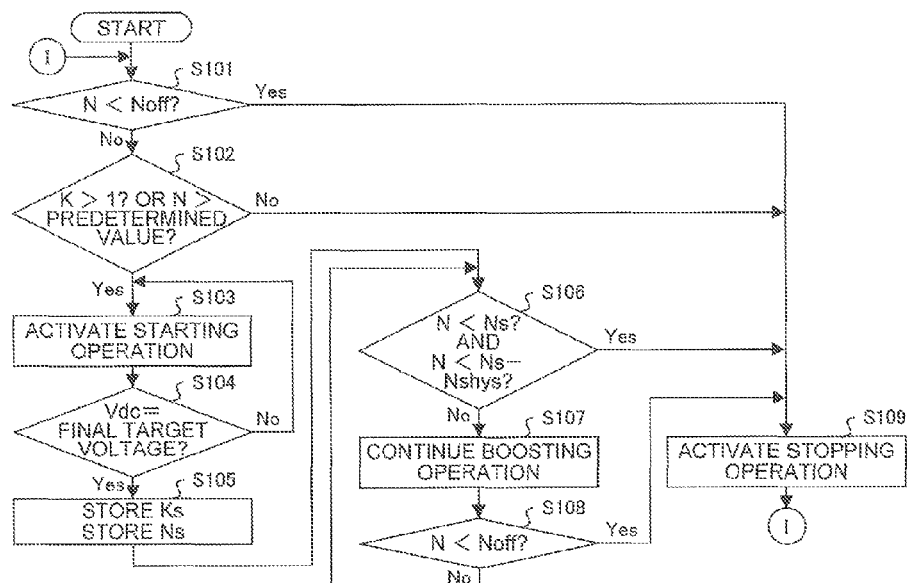
FIG. 5 is a diagram illustrating a flow of determining start and stop of the boosting operation of the motor drive control apparatus according to Embodiment 1.

FIG. 5 is a diagram illustrating a flow of determining the start and the stop of the boosting operation of the motor drive control apparatus according to Embodiment 1.

As illustrated in FIG. 5, in Step S101, the boosting operation stop determination unit 100 determines whether or not a preset rotation speed N that is currently set (i.e. in Step S101, that has been set) of the motor of the compressor 2 is smaller than the boosting operation forced stop rotation speed Noff set in advance, that is, determines whether or not the expression (6) is satisfied. The processing proceeds to Step S102 when the expression (6) is not satisfied, whereas the processing proceeds to Step S109 when the expression (6) is satisfied.

In Step S102, the boosting operation start determination unit 90 determines whether or not a modulation degree K currently computed by the inverter control unit 60 is larger than 1, that is, determines whether or not the expression (2) is satisfied, and further determines whether or not the preset rotation speed N that is currently set (having been set at Step 102) of the motor of the compressor 2 is larger than a predetermined value set in advance, that is, determines whether or not the expression (3) is satisfied. The processing proceeds to Step S103 when at least one of the expression (2) or the expression (3) is satisfied. Otherwise, the processing proceeds to Step S109.

In Step S103, the boosting operation start determination unit 90 sends a command for activating the starting operation of the boosting operation to the boost control unit 70, and the processing proceeds to Step S104. The boost control unit 70 sets a target voltage value to a DC bus voltage Vdc detected by the DC bus voltage detection unit 51 immediately before the boost control unit 70 receives the command for activating the starting operation of the boosting operation, and gradually increases the target voltage value to a final target voltage value with time from the time at which the boost control unit 70 receives the command for activating the starting operation of the boosting operation.

In Step S104, the boosting operation stop determination unit 100 determines whether or not a DC bus voltage Vdc detected currently (in Step S104) by the DC bus voltage detection unit 51 has reached the final target voltage value set by the target voltage setting unit 74a. The processing proceeds to Step S105 when the DC bus voltage Vdc has reached the final target voltage value. Otherwise, the processing returns to Step S103.

In Step S105, the boosting operation stop determination unit 100 stores a modulation degree K computed (computed in Step 105) by the inverter control unit 60 as the reference modulation degree Ks, and further stores a current preset rotation speed N of the motor of the compressor 2 as the reference preset rotation speed Ns. Then, the processing proceeds to Step S106.

In Step S106, the boosting operation stop determination unit 100 determines whether or not a modulation degree K computed in Step 106 by the inverter control unit 60 is smaller than the reference modulation degree Ks, that is, determines whether or not the expression (4) is satisfied, and further determines whether or not a current preset rotation speed N of the motor of the compressor 2 is smaller than a value obtained by subtracting the amount of hysteresis Nshys of the reference preset rotation speed Ns from the reference preset rotation speed Ns, that is, determines whether or not the expression (5) is satisfied. The processing proceeds to Step S107 when at least one of the expression (4) or the expression (5) is not satisfied, whereas the processing proceeds to Step S109 when both of the expression (4) and the expression (5) are satisfied.

In Step S107, the boosting operation stop determination unit 100 sends a command for continuing the boosting operation to the boost control unit 70, and the processing proceeds to Step S108.

In Step S108, the boosting operation stop determination unit 100 determines whether or not a current preset rotation speed N of the motor of the compressor 2 is smaller than the boosting operation forced stop rotation speed Noff set in advance, that is, determines whether or not the expression (6) is satisfied. The processing returns to Step S106 when the expression (6) is not satisfied, whereas the processing proceeds to Step S109 when the expression (6) is satisfied.

In Step S109, the boosting operation start determination unit 90 or the boosting operation stop determination unit 100 sends a command for activating the stopping operation of the boosting operation to the boost control unit 70, and the processing returns to Step S101. The boost control unit 70 sets a target voltage value to a DC bus voltage Vdc detected by the DC bus voltage detection unit 51 immediately before the boost control unit 70 receives the command for activating the stopping operation of the boosting operation, and gradually decreases the target voltage value with time from the time at which the boost control unit 70 receives the command for activating the stopping operation of the boosting operation.

(Details of Starting Operation of Boosting Operation)

Details of the starting operation of the boosting operation are hereinafter described.

Figure 6:
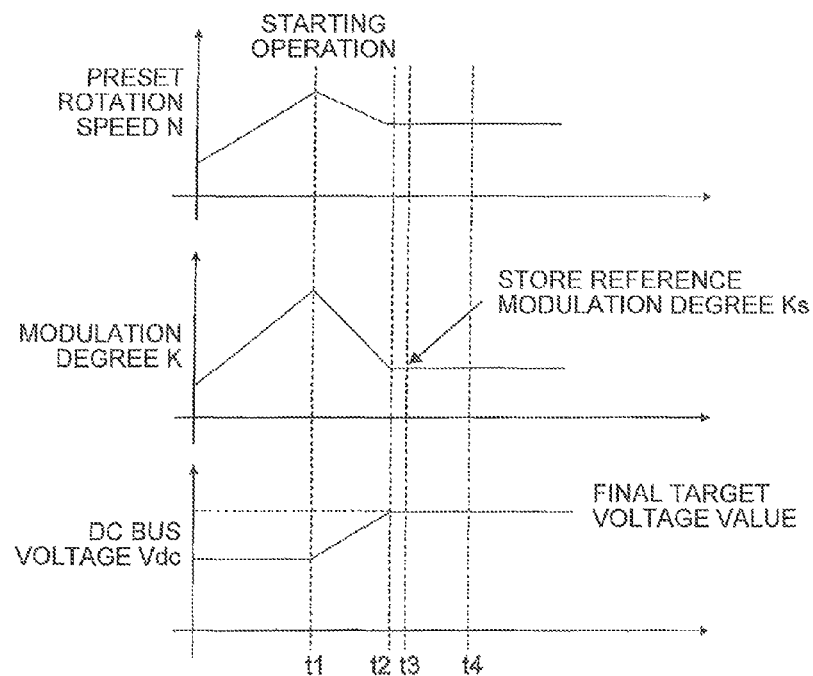
FIG. 6 is a diagram illustrating a time chart of a boosting operation of a motor drive control apparatus according to Comparative Example of the present invention when a set rotation speed decreases during voltage change.
Figure 7:
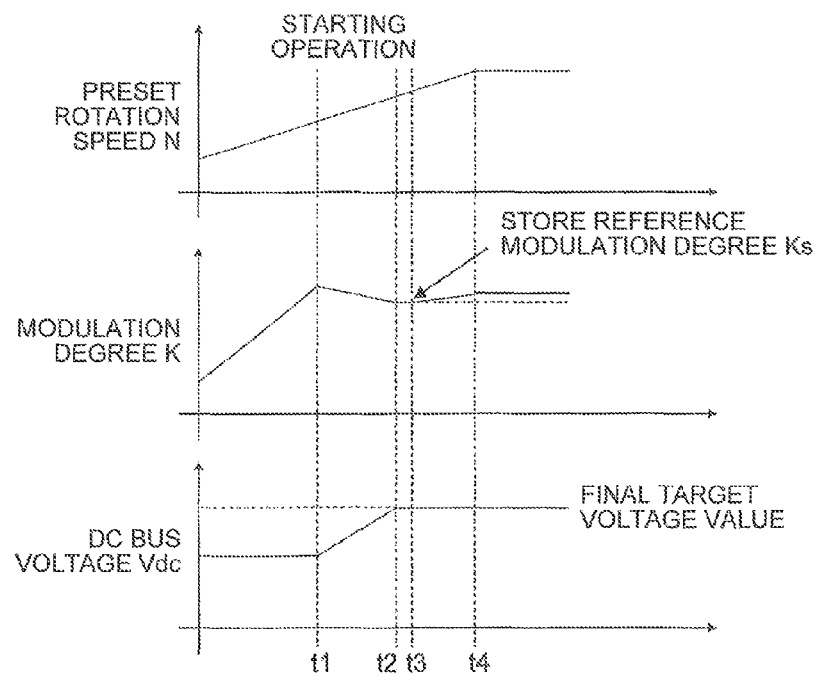
FIG. 7 is a diagram illustrating a time chart of a boosting operation of the motor drive control apparatus according to Comparative Example of the present invention when a set rotation speed increases during voltage change.

FIG. 6 is a diagram illustrating a time chart of a boosting operation of a motor drive control apparatus according to Comparative Example of the present invention when a set rotation speed decreases during voltage change. FIG. 7 is a diagram illustrating a time chart of the boosting operation of the motor drive control apparatus according to Comparative Example when the set rotation speed increases during voltage change.

After the starting operation of the boosting operation is activated, when the preset rotation speed N of the motor of the compressor 2 increases or decreases in the period during which the DC bus voltage Vdc detected by the DC bus voltage detection unit 51 is changed to reach the final target voltage value set by the target voltage setting unit 74a, that is, during voltage change in the period of t1 to t2, the modulation degree K is changed along with the change of the voltage command value, that is, the preset rotation speed N.

For example, as illustrated in FIG. 6, when the preset rotation speed N of the motor of the compressor 2 decreases during the voltage change in the period of t1 to t2, a value of the reference modulation degree Ks used for determining the stop of the boosting operation described above becomes smaller than its original value, and the boosting operation is continued even in the operating region in which the boosting operation is not required, that is, in the operating region in which the output voltage of the inverter circuit 40 is not saturated. Consequently, the operation efficiency of the air-conditioning apparatus 200 is reduced.

Moreover, for example, as illustrated in FIG. 7, when the preset rotation speed N of the motor of the compressor 2 is increased during the voltage change in the period of t1 to t2, the value of the reference modulation degree Ks used for determining the stop of the boosting operation described above becomes larger than its original value, and the boosting operation is stopped even in the operating region in which the boosting operation is required, that is, in the operating region in which the output voltage of the inverter circuit 40 is saturated. In addition, when the above-mentioned voltage change amount (slope of voltage change) per unit time of the target voltage value is set to be large and the preset rotation speed N of the motor of the compressor 2 increases during the voltage change in the period of t1 to t2, a current rapidly flows through the three-phase AC source 6, and the controllability of an anti-harmonic device such as an active filter and the controllability of the booster circuit 20 are deteriorated. Moreover, when the above-mentioned voltage change amount (slope of voltage change) of the target voltage value per unit time is set to be small and the preset rotation speed N of the motor of the compressor 2 increases during the voltage change in the period of t1 to t2, there is a risk in that the increase in output voltage of the inverter circuit 40 cannot follow the increase in preset rotation speed N, thereby increasing the current of the motor of the compressor 2, which leads to an overcurrent state.

Figure 8:
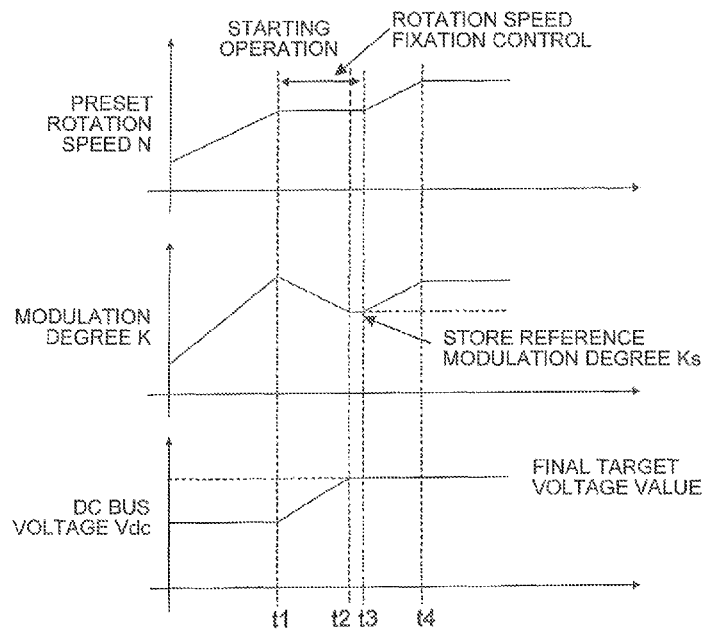
FIG. 8 is a diagram illustrating a time chart of a boosting operation of the motor drive control apparatus according to Embodiment 1.

FIG. 8 is a diagram illustrating a time chart of the boosting operation of the motor drive control apparatus according to Embodiment 1.

In the motor drive control apparatus 1, as illustrated in FIG. 8, the preset rotation speed N of the motor of the compressor 2 is fixed during the voltage change in the period of t1 to t2 (this control is referred to as "rotation speed fixation control"). Then, at t2 or t3, after the above-mentioned reference modulation degree Ks is stored, the rotation speed fixation control is cancelled to update the preset rotation speed N, thereby increasing or decreasing the rotation speed of the motor of the compressor 2. Note that, fixing the preset rotation speed N of the motor of the compressor 2 means not only fixing the preset rotation speed N of the motor of the compressor 2 so that the preset rotation speed N does not increase or decrease at all, but also fixing the preset rotation speed N of the motor of the compressor 2 so that the preset rotation speed N increases or decreases in a range not causing the above-mentioned problems.

Note that, in order to obtain a desired refrigeration capacity at any time, the target rotation speed computation unit 80 periodically calculates the target rotation speed n. Accordingly, when a new target rotation speed n is input during the rotation speed fixation control, that is, in the period of t1 to t2 or the period of t1 to t3, the inverter control unit 60 only stores the new target rotation speed n but does not update the preset rotation speed N. Then, at t2 or t3, after the above-mentioned reference modulation degree Ks is stored, the preset rotation speed N is updated to the stored target rotation speed n.

(Details of Stopping Operation of Boosting Operation)

Details of the stopping operation of the boosting operation are hereinafter described.

When the DC bus voltage Vdc detected by the DC bus voltage detection unit 51 drops and the preset rotation speed N of the motor of the compressor 2 decreases under the state in which the booster circuit 20 starts the stopping operation of the boosting operation to gradually decrease the target voltage value with time from the time of the reception of the command for activating the stopping operation of the boosting operation, the power consumption is reduced and an excessive current does not flow through the three-phase AC source 6 and the motor of the compressor 2. Thus, the rotation speed fixation control is not required to be performed when the DC bus voltage Vdc detected by the DC bus voltage detection unit 51 tends to drop and the preset rotation speed N of the motor of the compressor 2 tends to decrease.

Figure 9:
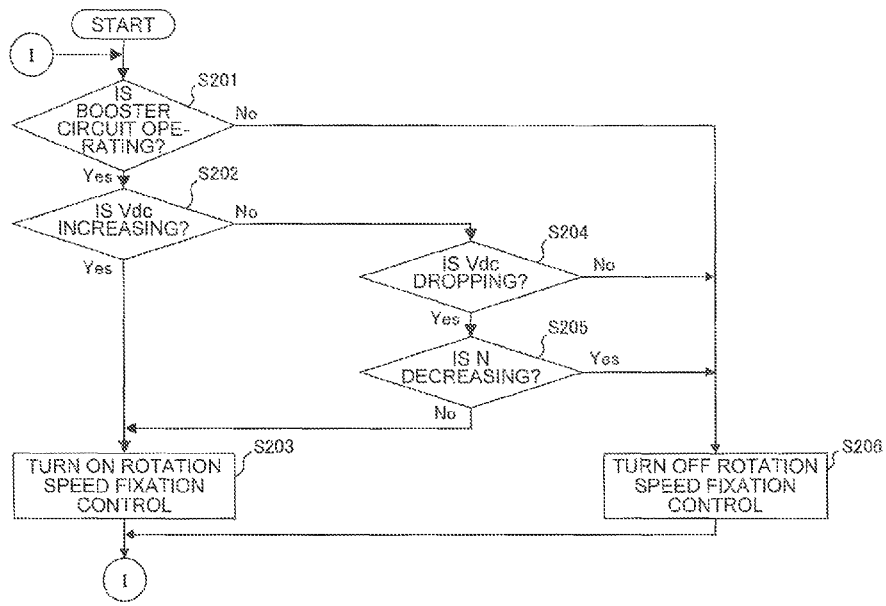
FIG. 9 is a diagram illustrating a flow of a stopping operation of the boosting operation of the motor drive control apparatus according to Embodiment 1.

FIG. 9 is a diagram illustrating a flow of the stopping operation of the boosting operation of the motor drive control apparatus according to Embodiment 1.

Specifically, as illustrated in FIG. 9, when receiving the command for activating the stopping operation of the boosting operation, the boost control unit 70 determines in Step S201 whether or not the booster circuit 20 is operating. The processing proceeds to Step S202 when the booster circuit 20 is operating. Otherwise, the processing proceeds to Step S206.

In Step S202, the boost control unit 70 determines whether or not a DC bus voltage Vdc detected by the DC bus voltage detection unit 51 at Step 201 is increasing. The processing proceeds to Step S203 when the DC bus voltage Vdc is increasing. Otherwise, the processing proceeds to Step S204.

In Step S203, the boost control unit 70 sends a command to the inverter control unit 60 so that the inverter control unit 60 sets the rotation speed fixation control in ON state, and the processing returns to Step S201.

In Step S204, the boost control unit 70 determines whether or not a DC bus voltage Vdc detected by the DC bus voltage detection unit 51 currently (in Step 204) is decreasing. The processing proceeds to Step S205 when the DC bus voltage Vdc is decreasing. Otherwise, the processing proceeds to Step S206.

In Step S205, the boost control unit 70 determines whether or not the preset rotation speed N of the motor of the compressor 2 is decreasing. The processing proceeds to Step S203 when the preset rotation speed N is not decreasing, whereas the processing proceeds to Step S206 when the preset rotation speed N is decreasing.

In Step S206, the boost control unit 70 sends a command to the inverter control unit 60 so that the inverter control unit 60 sets the rotation speed fixation control in OFF state, and the processing returns to Step S201.

Moreover, when the DC bus voltage Vdc detected by the DC bus voltage detection unit 51 can have a constant value and the preset rotation speed N of the motor of the compressor 2 is constant in the period of t2 to t4 or the period of t3 to t4 of FIG. 3, that is, in the period from the time when the reference modulation degree Ks is stored to the time when the stopping operation of the boosting operation is activated, the modulation degree K also has a substantially constant value in this period from the expression (1). Consequently, when the stopping operation of the boosting operation is activated, the expression (5) is satisfied while the expression (4) has already been satisfied, and hence the preset rotation speed N of the motor of the compressor 2 can be presumed as tending to decrease. Accordingly, the determinations made in Step S204 and Step S205 of FIG. 9 may be omitted.

Figure 10:
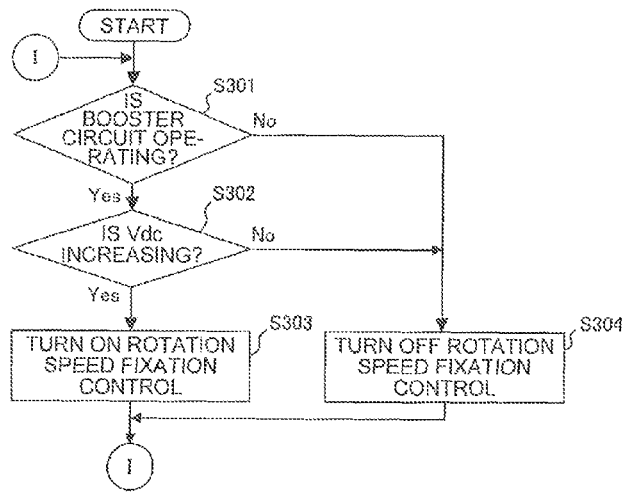
FIG. 10 is a diagram illustrating a flow of a stopping operation of the boosting operation of the motor drive control apparatus according to Embodiment 1.

FIG. 10 is a diagram illustrating a flow of the stopping operation of the boosting operation of the motor drive control apparatus according to Embodiment 1.

Specifically, as illustrated in FIG. 10, when receiving the command for activating the stopping operation of the boosting operation, the boost control unit 70 determines in Step S301 whether or not the booster circuit 20 is operating. The processing proceeds to Step S302 when the booster circuit 20 is operating. Otherwise, the processing proceeds to Step S304.

In Step S302, the boost control unit 70 determines whether or not a DC bus voltage Vdc detected by the DC bus voltage detection unit 51 currently (in Step 303) is increasing. The processing proceeds to Step S303 when the DC bus voltage Vdc is increasing. Otherwise, the processing proceeds to Step S304.

In Step S303, the boost control unit 70 sends a command to the inverter control unit 60 so that the inverter control unit 60 sets the rotation speed fixation control in ON state, and the processing returns to Step S301.

In Step S304, the boost control unit 70 sends a command to the inverter control unit 60 so that the inverter control unit 60 sets the rotation speed fixation control in OFF state, and the processing returns to Step S301.

(Reference Preset Rotation Speed Ns and Reference Modulation Degree Ks)

The above-mentioned reference preset rotation speed Ns is obtained by storing the preset rotation speed N of the motor of the compressor 2 at t2 or t3, that is, at the time when the starting operation of the boosting operation is completed. However, the rotation speed fixation control is in ON state when the DC bus voltage Vdc increases during the starting operation of the boosting operation, and hence the preset rotation speed N has a constant value in the period of t1 to t2 or the period of t1 to t3. Thus, the reference preset rotation speed Ns may be obtained by storing the preset rotation speed N of the motor of the compressor 2 at t1, that is, at the time when the starting operation of the boosting operation is activated. Through this operation, the following effect is obtained.

First, there is described a case where the reference preset rotation speed Ns is obtained by storing the preset rotation speed N of the motor of the compressor 2 at t2 or t3, that is, at the time when the starting operation of the boosting operation is completed.

Figure 11:
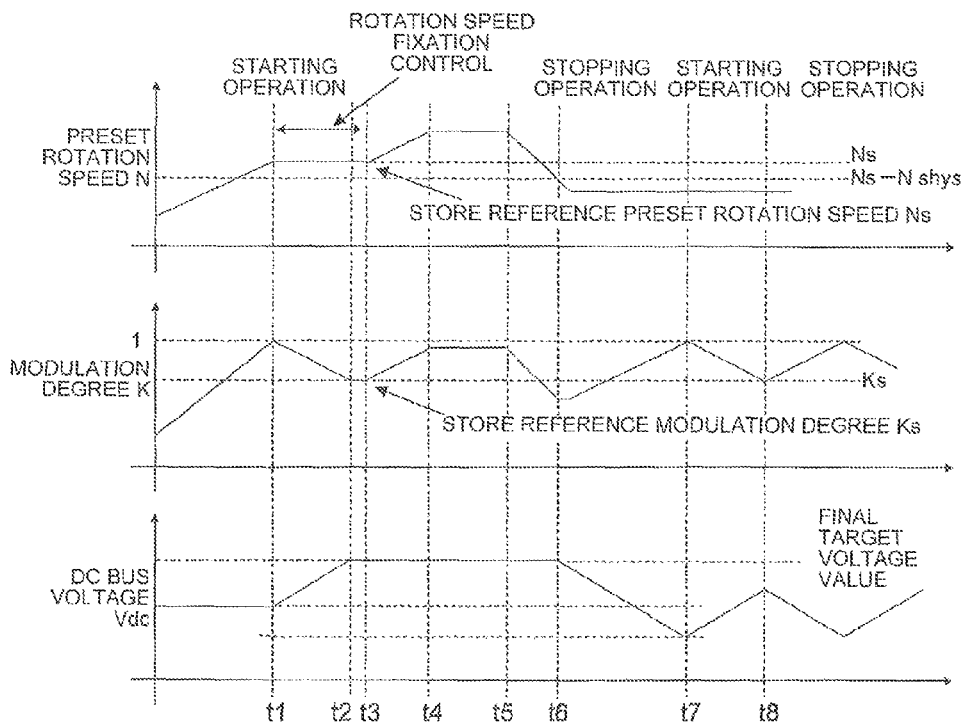
FIG. 11 is a diagram illustrating a time chart of a boosting operation of the motor drive control apparatus according to Comparative Example.

FIG. 11 is a diagram illustrating a time chart of the boosting operation of the motor drive control apparatus according to Comparative Example.

As illustrated in FIG. 11, for example, when the preset rotation speed N of the motor of the compressor 2 reduces to satisfy the expression (4) and the expression (5) at t5 in the boosting operation after t2, the stopping operation of the boosting operation of the booster circuit 20 is activated at t6.

Then, when the power supply voltage of the three-phase AC source 6 becomes lower than that before the starting operation of the boosting operation is activated, the DC bus voltage Vdc detected by the DC bus voltage detection unit 51 reduces to be lower than its value at t1, that is, at the time of the activation of the starting operation of the boosting operation, to thereby satisfy the expression (2) at t7. As a result, the starting operation of the boosting operation is activated again.

At this time, when the reference preset rotation speed Ns is obtained by storing the preset rotation speed N of the motor of the compressor 2 at t2 or t3, that is, at the time when the starting operation of the boosting operation is completed, both of the expression (4) and the expression (5) are satisfied at t8, that is, in a process in which the DC bus voltage Vdc detected by the DC bus voltage detection unit 51 is increased to the final target voltage value, with the result that the stopping operation of the boosting operation of the booster circuit 20 is activated. That is, the preset rotation speed N of the motor of the compressor 2 does not change, and hence the expression (5) is satisfied at t8. Moreover, the modulation degree K computed by the inverter control unit 60 is compared to a reference modulation degree Ks stored at t2 or t3, that is, at the time when the starting operation of a previous boosting operation is completed, and hence the expression (4) is satisfied at t8. In other words, the command for starting the starting operation and the command for starting the stopping operation of the boosting operation are repeatedly provided under the state in which the starting operation of the boosting operation is not completed, which leads to hunting of the DC bus voltage Vdc detected by the DC bus voltage detection unit 51.

Next, there is described a case where the reference preset rotation speed Ns is obtained by storing the preset rotation speed N of the motor of the compressor 2 at t1, that is, at the time when the starting operation of the boosting operation is activated.

Figure 12:
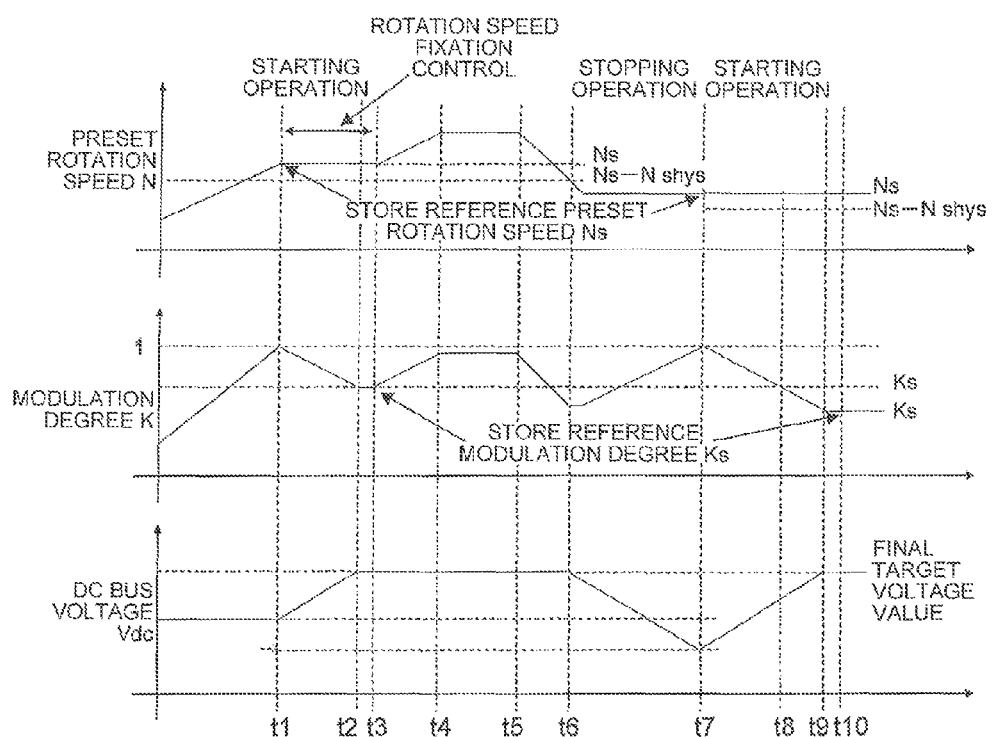
FIG. 12 is a diagram illustrating a time chart of a boosting operation of the motor drive control apparatus according to Embodiment 1.

FIG. 12 is a diagram illustrating a time chart of the boosting operation of the motor drive control apparatus according to Embodiment 1.

As illustrated in FIG. 12, when the reference preset rotation speed Ns is obtained by storing the preset rotation speed N of the motor of the compressor 2 at t1, that is, at the time when the starting operation of the boosting operation is activated, the reference preset rotation speed Ns is updated when the starting operation of the boosting operation is activated again at t7. As a result, the expression (5) is not satisfied at t8 and the booster circuit 20 does not activate the stopping operation of the boosting operation. Consequently, the hunting of the DC bus voltage Vdc detected by the DC bus voltage detection unit 51 is suppressed. Note that, the reference modulation degree Ks is updated at t9 or t10, that is, at the time when the starting operation of the boosting operation is completed again.

Moreover, the reference preset rotation speed Ns and the reference modulation degree Ks described above may be initialized at t6, that is, at the time when both of the expressions (4) and (5) are satisfied. Also through this operation, the effect similar to that described above is obtained.

<Actions of Motor Drive Control Apparatus>

Working of the motor drive control apparatus according to Embodiment 1 are hereinafter described.

In the motor drive control apparatus 1, the inverter control unit 60 controls, while the boost control unit 70 is controlling the booster circuit 20 to perform the starting operation of the boosting operation or the stopping operation of the boosting operation, the inverter circuit 40 to operate so as to fix the rotation speed of the motor, and it is therefore possible to freely change and set the voltage change amount (slope of voltage change) of the DC bus voltage Vdc per unit time during the starting operation of the boosting operation or the stopping operation of the boosting operation, the DC bus voltage Vdc being the output voltage from the booster circuit 20. Consequently, the stability of the control of an anti-harmonic device such as an active filter and the control of the booster circuit 20 is ensured. For example, the voltage change amount is set such that the DC bus voltage Vdc reaches the final target voltage value in several seconds, to thereby suppress the influence on the performance as the air-conditioning apparatus 200.

Moreover, the boosting operation start determination unit 90 and the boosting operation stop determination unit 100 respectively determine, based on the reference modulation degree Ks and the reference preset rotation speed Ns, the activation of the starting operation of the boosting operation and the stopping operation of the boosting operation. Thus, the boosting operation is reliably performed only in the operating region in which the boosting operation is required, and hence the operation efficiency is improved. Moreover, due to a synergistic effect of the above-mentioned improvement and the fact that the inverter control unit 60 controls, while the boost control unit 70 is controlling the booster circuit 20 to perform the starting operation of the boosting operation or the stopping operation of the boosting operation, the inverter circuit 40 to operate so as to fix the rotation speed of the motor, the stable operation of the starting operation and the stopping operation of the boosting operation of the booster circuit 20 is further reliably ensured.

REFERENCE SIGNS LIST

1 motor drive control apparatus 2 compressor 3 condenser 4 expansion device 5 evaporator 6 three-phase AC source 7 fan 10 three-phase rectifier 20 booster circuit 21 reactor 22 switching element 23 backflow preventing element 30 smoothing capacitor 40 inverter circuit 51 DC bus voltage detection unit 52 motor current detection unit 53 reactor current detection unit 60 inverter control unit 70 boost control unit 74a target voltage setting unit 74b voltage command value computation unit 74c electric current command value computation unit 74d switching signal generation unit 80 target rotation speed computation unit 90 boosting operation start determination unit 100 boosting operation stop determination unit 200 air-conditioning apparatus

The invention claimed is:

1. A motor drive control apparatus, comprising:
a rectifier to rectify an AC voltage supplied from an AC source;
a booster circuit including a reactor, a switching element, and a backflow preventing element, the booster circuit being configured to boost a DC bus voltage supplied from the rectifier;
a smoothing capacitor to smooth an output of the booster circuit;
an inverter circuit to convert the DC bus voltage smoothed by the smoothing capacitor into an AC voltage and supply the AC voltage to a motor;
a boost control unit to control operation of the booster circuit;
an inverter control unit to control operation of the inverter circuit; and
a DC bus voltage detection unit to detect the DC bus voltage supplied from the booster circuit, wherein
the boost control unit being configured to perform a starting operation or a stopping operation of a boosting operation based on a modulation degree of conversion by the inverter control unit from the DC bus voltage into the AC voltage, and
the inverter control unit being configured to control, while the boost control unit is controlling the booster circuit to perform the boosting operation, the inverter circuit to fix a set rotation speed of the motor when the DC bus voltage supplied from the booster circuit is increasing.

2. The motor drive control apparatus of claim 1, wherein the boost control unit is configured to change and set a change amount per unit time of the DC bus voltage supplied from the booster circuit, the change amount being measured when the boost control unit is controlling the booster circuit to perform the starting operation of the boosting operation or the stopping operation of the boosting operation.

3. The motor drive control apparatus of claim 1, wherein at least one of the switching element or the backflow preventing element includes a wide bandgap semiconductor.

4. The motor drive control apparatus of claim 3, wherein the wide bandgap semiconductor includes a silicon carbide element, a gallium nitride-based element, or a diamond element.

5. A compressor, comprising:
the motor drive control apparatus of claim 1, and
a motor to be driven by the motor drive control apparatus.

6. A fan, comprising:
the motor drive control apparatus of claim 1; and
a motor to be driven by the motor drive control apparatus.

7. An air-conditioning apparatus, comprising:
the motor drive control apparatus of claim 1; and
a motor driven by the motor drive control apparatus.

8. The motor drive control apparatus of claim 1, wherein the boost control unit is configured to perform the stopping operation of the boosting operation based on the modulation degree that is stored at a time when the starting operation of the boosting operation is completed.

9. The motor drive control apparatus of claim 8, wherein the boost control unit is configured to perform the stopping operation of the boosting operation based on the set rotation speed of the motor that is stored at a same timing of storing the modulation degree.

10. The motor drive control apparatus of claim 1, wherein the boost control unit is configured to perform the starting operation of the boosting operation when the modulation degree exceeds a predetermined value.

11. The motor drive control apparatus of claim 1, wherein the boost control unit is configured to perform the starting operation of the boosting operation based on the set rotation speed of the motor.

* * * * *